United States Patent
Huang et al.

(10) Patent No.: US 9,812,660 B2
(45) Date of Patent: Nov. 7, 2017

(54) METHOD FOR SINGLE CRYSTAL GROWTH OF PHOTOVOLTAIC PEROVSKITE MATERIAL AND DEVICES

(71) Applicant: NUtech Ventures, Lincoln, NE (US)

(72) Inventors: Jinsong Huang, Lincoln, NE (US); Qingfeng Dong, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 15/009,701

(22) Filed: Jan. 28, 2016

(65) Prior Publication Data
US 2016/0248028 A1 Aug. 25, 2016

Related U.S. Application Data

(63) Continuation-in-part of application No. 14/576,878, filed on Dec. 19, 2014, now Pat. No. 9,391,287.
(Continued)

(51) Int. Cl.
*H01L 51/42* (2006.01)
*H01L 51/44* (2006.01)
(Continued)

(52) U.S. Cl.
CPC ............ *H01L 51/4293* (2013.01); *C30B 7/08* (2013.01); *C30B 19/062* (2013.01); *C30B 29/54* (2013.01); *H01L 27/302* (2013.01); *H01L 31/076* (2013.01); *H01L 51/0002* (2013.01); *H01L 51/424* (2013.01); *H01L 51/4213* (2013.01);
(Continued)

(58) Field of Classification Search
CPC ............... H01L 51/4293; H01L 51/442; H01L 51/0002; H01L 51/424; H01L 51/4213; H01L 51/441; H01L 31/076; H01L 27/302; H01L 51/005; H01L 51/0037;
(Continued)

(56) References Cited

U.S. PATENT DOCUMENTS

| 4,030,964 A | 6/1977 | Schieber et al. |
| 5,641,544 A | 6/1997 | Melancon et al. |

(Continued)

FOREIGN PATENT DOCUMENTS

| CN | 104131352 A | 11/2014 |
| WO | WO 2014/020499 A1 | 2/2014 |

OTHER PUBLICATIONS

Yasutaka Takahashi et al., "Dip-coating conditions and modifications of lead titanate and leas zirconate titante films", Journal of Materials Science, vol. 25, 1990, pp. 3950-3955.*
(Continued)

*Primary Examiner* — William Coleman
(74) *Attorney, Agent, or Firm* — Leydig, Voit & Mayer, Ltd.; Gerald T. Gray

(57) ABSTRACT

Systems and methods for perovskite single crystal growth include using a low temperature solution process that employs a temperature gradient in a perovskite solution in a container, also including at least one small perovskite single crystal, and a substrate in the solution upon which substrate a perovskite crystal nucleates and grows, in part due to the temperature gradient in the solution and in part due to a temperature gradient in the substrate. For example, a top portion of the substrate external to the solution may be cooled.

19 Claims, 14 Drawing Sheets

Related U.S. Application Data

(60) Provisional application No. 62/108,863, filed on Jan. 28, 2015, provisional application No. 61/918,330, filed on Dec. 19, 2013.

(51) Int. Cl.
*H01L 51/00* (2006.01)
*H01L 27/30* (2006.01)
*H01L 31/076* (2012.01)
*C30B 19/06* (2006.01)
*C30B 7/08* (2006.01)
*C30B 29/54* (2006.01)
*H01L 31/0256* (2006.01)

(52) U.S. Cl.
CPC .......... *H01L 51/441* (2013.01); *H01L 51/442* (2013.01); *H01L 51/005* (2013.01); *H01L 51/0037* (2013.01); *H01L 51/0077* (2013.01); *H01L 2031/0344* (2013.01); *Y02E 10/549* (2013.01)

(58) Field of Classification Search
CPC .......... C30B 19/062; C30B 29/54; C30B 7/08; Y02E 10/549
See application file for complete search history.

(56) References Cited

U.S. PATENT DOCUMENTS

| | | | |
|---|---|---|---|
| 6,350,946 B1 | 2/2002 | Miyake et al. | |
| 6,511,615 B1 | 1/2003 | Dawes et al. | |
| 7,972,527 B2 * | 7/2011 | Luo | C30B 11/00 117/81 |
| 2002/0179000 A1 | 12/2002 | Lee et al. | |
| 2003/0059540 A1 | 3/2003 | Berni et al. | |
| 2006/0268493 A1 | 11/2006 | Miyasaka et al. | |
| 2010/0001619 A1 | 1/2010 | Yuuya et al. | |
| 2011/0059540 A1 | 3/2011 | Jonas et al. | |
| 2014/0332078 A1 * | 11/2014 | Guo | H01L 51/424 136/261 |
| 2015/0144195 A1 | 5/2015 | Irwin et al. | |

OTHER PUBLICATIONS

Yasutaka Takahashi et al.,"Dip-coating conditions and modifications of lead titanate and lead zirconate titanate films", 1990,Journal of Materials Science, vol. 25, pp. 3950-3955.*

Takashi Hayashi et al., "Preparation and Dielectric Properties of SrTiO3/BaTiO3 Multilayer Thin Films by Sol-Gel Method", Sep. 1995, Japanese Journal of Applied Physics, vol. 34, pp. 5100-5104.*

International Search Report for PCT/US2016/015458 dated Jun. 3, 2016.

International Search Report for PCT/US2016/015472 dated Jun. 3, 2016.

International Preliminary Report on Patentability for PCT/US2016/015458 dated Aug. 10, 2017.

International Preliminary Report on Patentability for PCT/US2016/015472 dated Aug. 10, 2017.

* cited by examiner

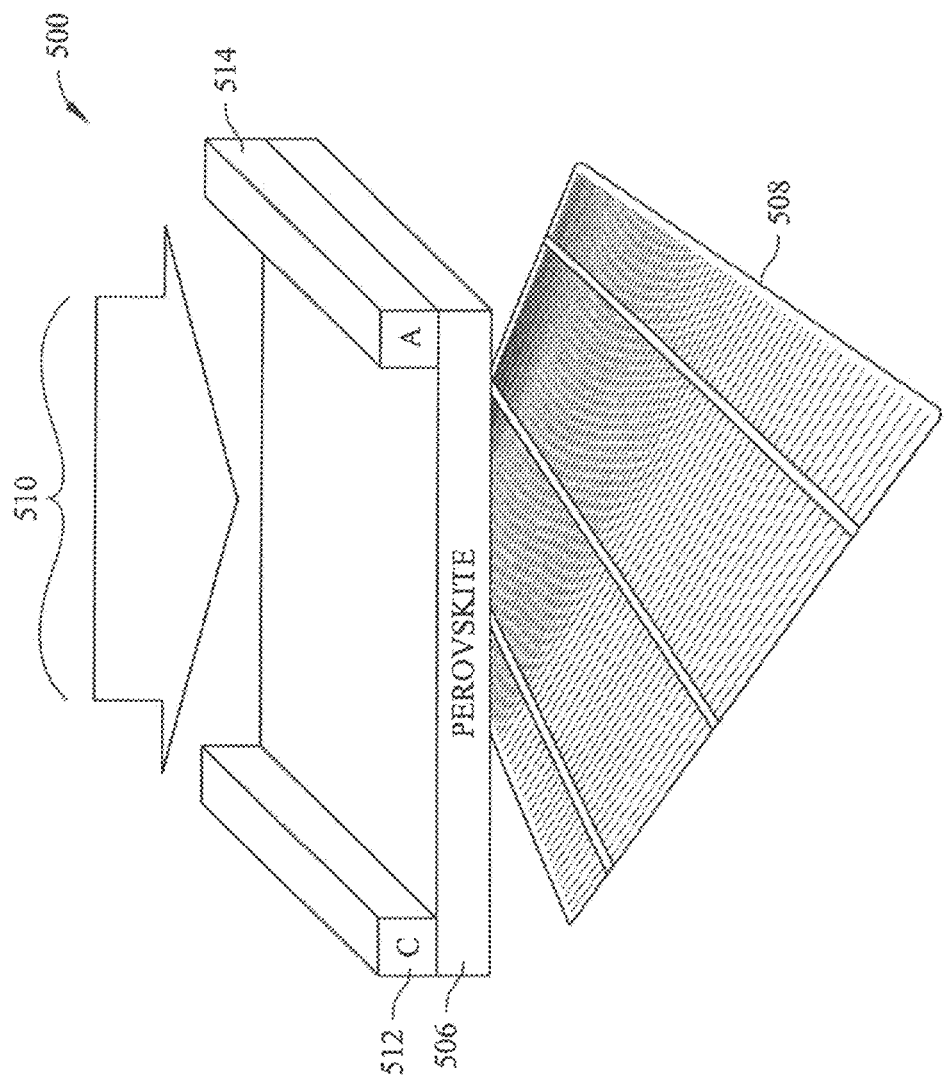

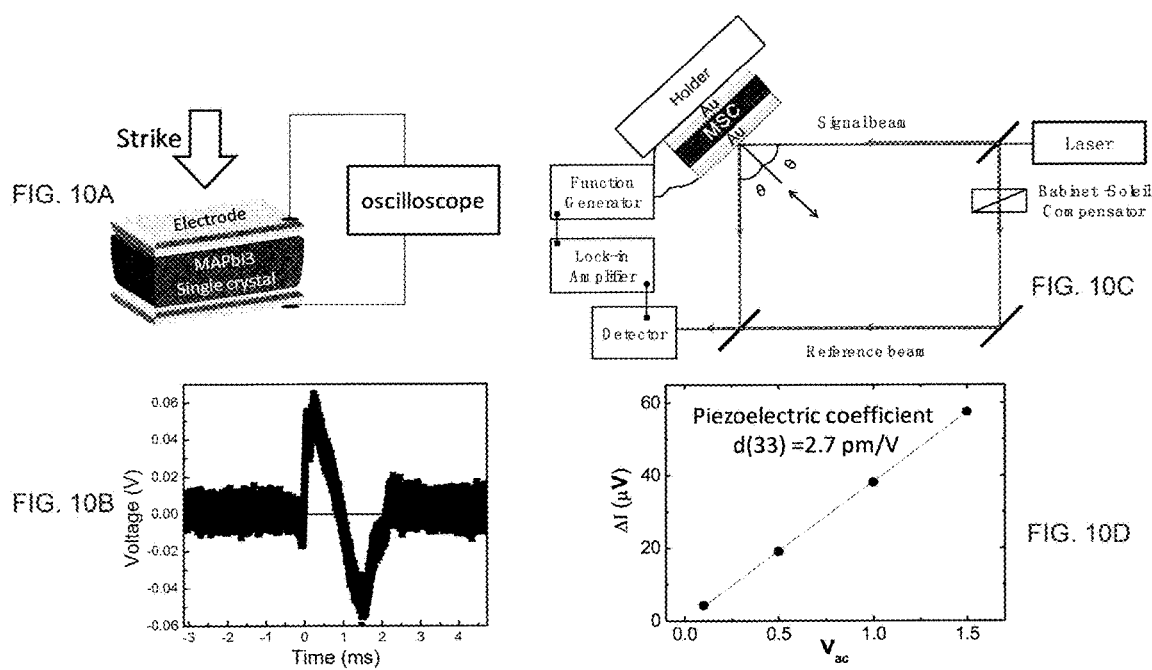

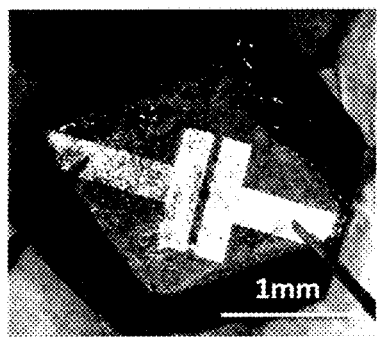
FIG. 11A
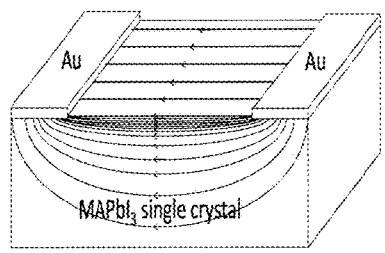
FIG. 11B
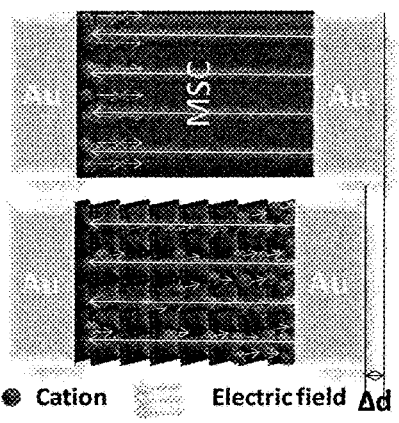
FIG. 11C
FIG. 11D
● Cation   Electric field Δd
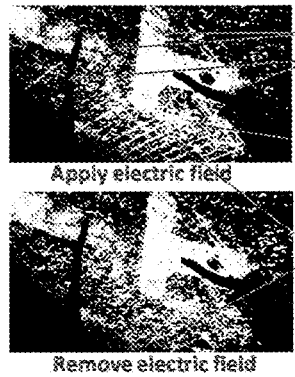
FIG. 11E
FIG. 11F

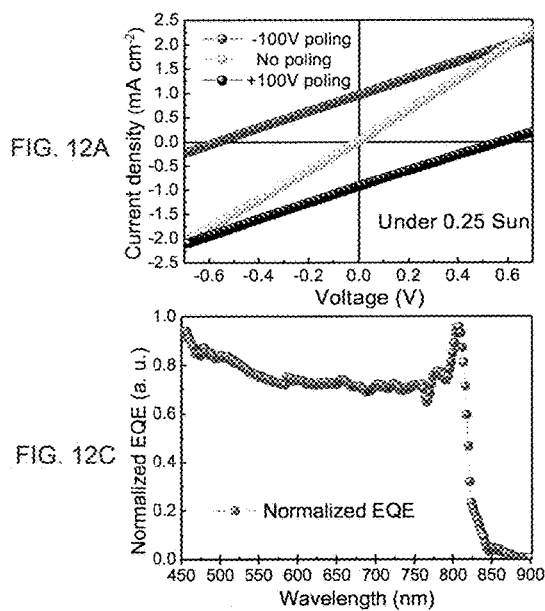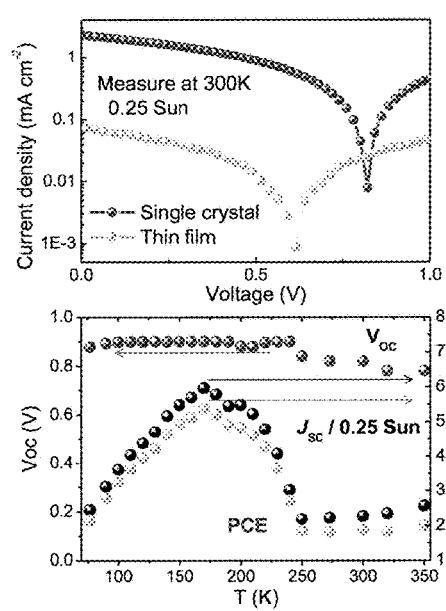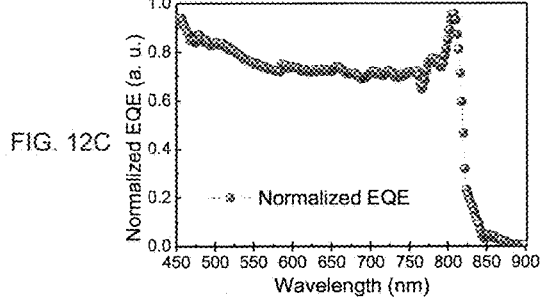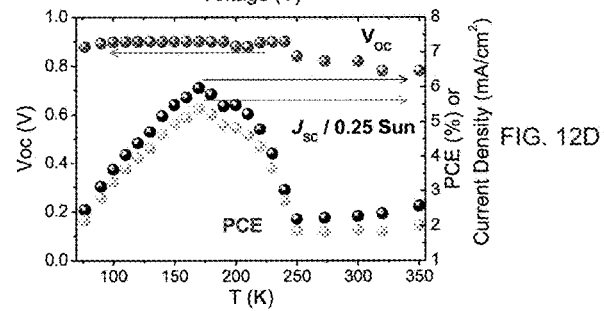

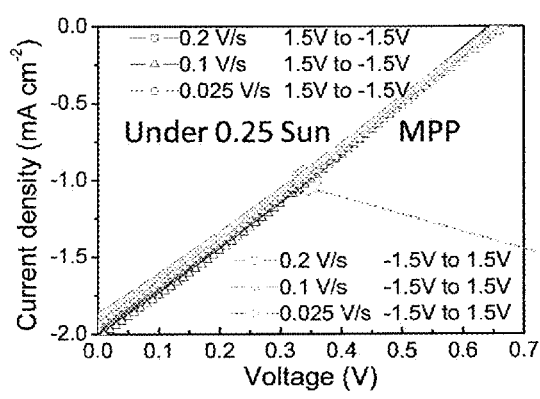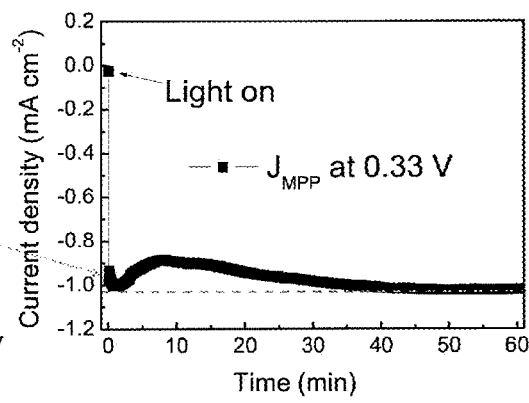
FIG. 13A
FIG. 13B

METHOD FOR SINGLE CRYSTAL GROWTH OF PHOTOVOLTAIC PEROVSKITE MATERIAL AND DEVICES

CROSS-REFERENCE TO RELATED APPLICATIONS

The present application claims the benefit under 35 U.S.C. §119(e) of U.S. Provisional Application Ser. No. 62/108,863, filed Jan. 28, 2015, and titled "METHOD FOR SINGLE CRYSTAL GROWTH OF PHOTOVOLTAIC PEROVSKITE MATERIAL AND DEVICES," which is hereby incorporated by reference in its entirety.

FEDERALLY SPONSORED RESEARCH OR DEVELOPMENT

This invention was made with Government support under contract DE-EE0006709 awarded by the Department of Energy (DOE), and under contract HDTRA1-14-1-0030 awarded by the Defense Threat Reduction Agency (DTRA). The Government has certain rights in this invention.

BACKGROUND

The Sun deposits 120,000 terawatts (TW) of power onto the Earth's surface. This is more than the 13 TW of total power that is currently used by the planet's population. Photovoltaics (PV) convert solar energy into direct current electricity using semiconducting materials that exhibit the photovoltaic effect. The photovoltaic effect includes photons of light exciting electrons into a higher state of energy, allowing them to act as charge carriers for an electric current. A photovoltaic system can employ solar panels including a number of solar cells to supply usable solar power.

Organometal trihalide perovskites (OTPs, e.g., $CH_3NH_3PbX_3$, X=Cl, Br, I or a mixed halide) can be excellent low-cost, earth-abundant photovoltaic materials due to advantageous properties of these materials, such as proper bandgap, excellent crystallinity, and strong absorption. In addition, OTPs have advantageous optoelectronic properties, such as a very large carrier mobility comparable to silicon, bipolar transport, and large charge carrier diffusion length, which enables high performance devices with the traditional planar heterojunction (PHJ) structure.

Perovskite photovoltaic devices (PPVs) have been demonstrated to have all the desired properties of organic photovoltaic devices (OPVs), which have strong market potential in military and civilian applications, including for flexible, wearable, lightweight, and portable chargers for electronics, building-integrated photovoltaics (BIPVs), and off-grid power generation. PPVs have shown all three main competencies of that OPVs have over other photovoltaic technologies: 1) PPVs can be made on flexible plastic substrates; 2) PPVs can be fabricated with low cost materials and a solution process; 3) Perovskite materials have tunable color and bandgaps with semitransparency, which allows for the integration of PPVs into buildings. State-of-the-art PPV devices can have an efficiency of 20%, but they need to reach 25% to compete with other commercialized thin film solar cell technologies in order to make them commercially viable. The thermodynamic efficiency limit of single junction PPVs can be 38% based on its bandgap.

High mobility and lifetime is important for photonic devices because the light-generated electrons and holes can move longer distances to be extracted as current, thus avoiding release of their energy as heat within the recombination. High mobility and high carrier lifetimes are also crucial for photo detectors. For example, in an organic/inorganic hybrid photo detector, if one type of carriers (e.g., electrons) can be trapped longer, the other type of carriers (e.g., holes) thus circulates many times with high mobility through the polymer matrix or network. In this case, ultrahigh gain (gain may be defined by the ratio of the lifetime of the trapped electrons and the transit time of holes), can be obtained.

Despite the high efficiency reported in devices fabricated by thermal evaporation, the complicated controlling of the non-stoichiometry of OTPs such as $CH_3NH_3PbI_{3-x}Cl_x$ by co-evaporation under high vacuum dims its advantage of being low cost. Low temperature solution processes are attractive in the fabrication of electronic devices, especially large-area solar cells, for reducing fabrication costs.

Accordingly, there is a need for different systems and methods for fabricating large perovskite single crystals for use in photoactive devices.

SUMMARY

Accordingly, the present disclosure generally provides systems and methods for fabricating photoactive device structures, and more particularly to photoactive devices including a photoactive perovskite single crystal and systems and methods for fabricating the same. The polycrystalline perovskite materials formed according to embodiments herein advantageously have long, balanced electron and hole diffusion lengths on the order of 3 millimeters or greater.

In certain embodiments, perovskite single crystal growth is accomplished using a low temperature solution process that employs a temperature gradient in a perovskite solution in a container, also including at least one small perovskite single crystal, and a substrate in the solution upon which substrate a perovskite crystal nucleates and grows, in part due to the temperature gradient in the solution and in part due to a temperature gradient in the substrate. For example, a top portion of the substrate external to the solution may be cooled.

According to an embodiment, a process or method for growing a single perovskite crystal is provided. The process typically includes generating a temperature gradient in a perovskite precursor solution, and positioning a substrate in the precursor solution at a cooler portion of the solution where the temperature is cooler than at a warmer portion of the solution due to the temperature gradient, the substrate having a first end extending within the precursor solution toward the warmer portion of the solution, wherein a perovskite crystal nucleates and grows on the substrate proximal to the first end of the substrate to form a large-size perovskite single crystal. In certain aspects, the process further includes cooling a distal end of the substrate external to the solution. In certain aspects, cooling includes providing a cool airflow proximal to the distal end of the substrate. In certain aspects, the precursor solution is contained within a container, wherein at least a bottom portion of the container is within a hot fluid bath, and wherein the at least one small perovskite crystal is placed proximal to the bottom portion of the container which corresponds to the warmer portion of the solution. In certain aspects, the process further includes placing at least one perovskite single crystal, or perovskite powders, in the precursor solution at the warmer portion of the solution where the temperature is higher than at the cooler portion of the solution due to the temperature gradient. In certain aspects, the warmer portion of the solution is at a temperature of about 40° C. to about 200° C., and wherein the cooler portion of the solution is at a temperature of about 20° C. to about 130° C. In certain aspects, the solution in the cooler portion is supersaturated. In certain aspects, the at least one perovskite single crystal includes a $MAPbI_3$ crystal or powders. In certain aspects, the large-size perovskite single crystal includes at least one $MAPbI_3$ crystal having a dimension of greater than 3 millimeters. In certain aspects, the large-size perovskite single crystal includes at least one perovskite single crystal having a dimension of greater than about 3 millimeters. In certain aspects, the at least one small perovskite single crystal has a dimension of less than 3 millimeters. In certain aspects, the perovskite single crystal is a perovskite having a structure of $AMX_3$, wherein A is methylammonium ($CH_3NH_3+$), Cs+ or formamidinum ($H_2NCHNH_2+$), M is a metal cation, and X is a halide anion, thiocyanate (SCN−), M is a metal cation, and X is a halide anion, thiocyanate (SCN−) or mixture of them. In certain aspects, the metal cation is $Pb_2+$, and wherein the halide ion is one of I−, Cl−, Br− or a mixture thereof.

According to another embodiment, a perovskite crystal photovoltaic device having a lateral electrode structure is provided that typically includes a perovskite single crystal defining a planar perovskite layer, a first electrode disposed on a first side of the planar perovskite layer, and a second electrode disposed on the first side of the planar perovskite layer or on a second side of the planar perovskite layer opposite the first side, wherein the second electrode is displaced from the first electrode along a planar direction defined by the planar perovskite layer, such that when activated by illumination impinging on the perovskite single crystal, a charge flows in the perovskite single crystal along the planar direction between the first and second electrodes. In certain aspects, the perovskite single crystal has a structure of $AMX_3$, wherein A is methylammonium ($CH_3NH_3+$), M is a metal cation, and X is a halide anion. In certain aspects, each of the first and second electrodes includes at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, indium tin oxide (ITO), fluorine-doped tin oxide (FTO), aluminum-doped zinc oxide (AZO), antimony-tin mixed oxide (ATO), a thin metal, a conductive polymer, a network of metal nanowire, a network of carbon nanowire, nanotube, nanosheet, nanorod, carbon nanotube, silver nanowire, or graphene, or a combination thereof. In certain aspects, the perovskite single crystal has a thickness between about 100 nm and about 5 μm. In certain aspects, the perovskite single crystal is as grown or peeled or cut from a perovskite single crystal with a thickness of greater than 1 μm. In certain aspects, the first electrode and the second electrode are both non-transparent to the illumination impinging on the perovskite single crystal. In certain aspects, the second electrode in on the first side. In certain aspects, the device further includes a substrate layer covering at least one of the first electrode or the second electrode. In certain aspects, the device further includes a substrate layer covering both of the first electrode and the second electrode. In certain aspects, the perovskite single crystal has a thickness between about 1 μm and about 1 cm. In certain aspects, the first electrodes is parallel to the second electrode and wherein an electric field is applied to the perovskite crystal layer to produce a p-i-n structure. In certain aspects, the first electrode and the second electrode comprise different materials. In certain aspects, the perovskite single crystal is a perovskite having a structure of $AMX_3$, wherein A is methylammonium ($CH_3NH_3+$), Cs+ or formamidinum ($H_2NCHNH_2+$), M is a metal cation, and X is a halide anion, thiocyanate (SCN−), M is a metal cation, and X is a halide anion, thiocyanate (SCN−) or mixture of them. In certain aspects, the metal cation is $Pb_2+$, and wherein the halide ion is one of I−, Cl−, Br− or a mixture thereof.

According to yet another embodiment, a perovskite single crystal radiation detector device is provided that typically includes a perovskite single crystal, a first electrode disposed on a first surface of the perovskite single crystal, and a second electrode disposed on one of the first side or a second side of the perovskite single crystal opposite the first side, wherein the perovskite single crystal has a thickness of less than about 3 cm between the first side and the second side, and wherein the perovskite single crystal has a diffusion length of about 3 mm or greater. In certain aspects, the thickness of the perovskite single crystal is between about 1 μm and about 1 cm. In certain aspects, the thickness of the perovskite single crystal is between about 10 nm and about 3 mm. In certain aspects, the perovskite single crystal is as grown, peeled or cut from a large perovskite crystal having a thickness of about 3 mm or greater. In certain aspects, the perovskite single crystal is a perovskite having a structure of $AMX_3$, wherein A is methylammonium ($CH_3NH_3+$), Cs+ or formamidinum ($H_2NCHNH_2+$), M is a metal cation, and X is a halide anion, thiocyanate (SCN−), M is a metal cation, and X is a halide anion, thiocyanate (SCN−) or mixture of them. In certain aspects, the metal cation is $Pb_2+$, and wherein the halide ion is one of I−, Cl−, Br− or a mixture thereof.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DRAWINGS

The detailed description is described with reference to the accompanying figures. The use of the same reference numbers in different instances in the description and the figures may indicate similar or identical items.

FIG. 6 is an isometric view illustrating of a tandem solar cell device including a lateral single crystal device according to an embodiment.

FIG. 10 shows piezoelectric measurement of $MAPbI_3$ single-crystals: FIG. 10A: Set up; and FIG. 10B: voltage output over time recorded by oscilloscope by striking the single-crystal devices against a lab table. The single crystal device in this study had two electrodes deposited on parallel surfaces of the crystal; FIG. 10C: Set up of the high-resolution Mach-Zehnder interferometer for the piezoelectric coefficient measurements; FIG. 10D: Plot of the intensity modulation ΔI vs amplitude of the 1 kHz ac electric field applied across the crystal. The crystal was poled under 0.1 V/μm electric field across the paralleled electrodes for 5 min then turned off, while the small sinusoidal ac voltage at frequency of 1 kHz acted as the piezoelectric driving field.

FIG. 11 shows piezoelectric poling of $MAPbI_3$ lateral structure single-crystal solar cells. FIG. 11A, An image of MAPbI3 lateral structure single-crystal device. FIG. 11B: Illustration of the poling electric field distribution in top surface and cross-section of a lateral single crystal device. FIG. 11C and FIG. 11D: Scheme of electromechanical strain generated grain boundaries and irons migration in $MAPbI_3$ single crystals. FIG. 11E and FIG. 11F: Images of $MAPbI_3$ lateral structure single-crystal devices with and without applied electric field.

FIG. 12 shows device performance of $MAPbI_3$ single-crystal solar cells. FIG. 12A: Switchable photovoltaic effect of a $MAPbI_3$ lateral-structure single-crystal solar cell with positive and negative poling. FIG. 12B: Photocurrents of the MAPbI3 single crystals and polycrystalline thin films with a same electrode spacing of 50 μm under 25 mW cm-2 illumination at room temperature. FIG. 12C: EQE curve and FIG. 12D: temperature dependent device performance of the $MAPbI_3$ single-crystal solar cell.

FIG. 13A shows photocurrents of the $MAPbI_3$ lateral structure single-crystal device tested under different scanning rate and scanning directions; FIG. 13B shows measured photocurrent output at the maximum power point for 1 hour.

Figure 14A:
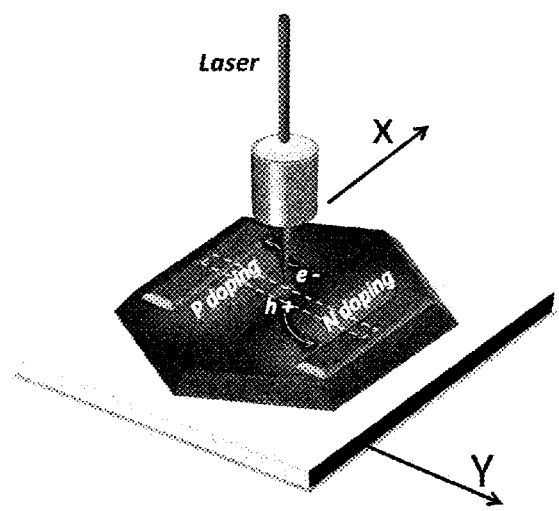
Figure 14B:
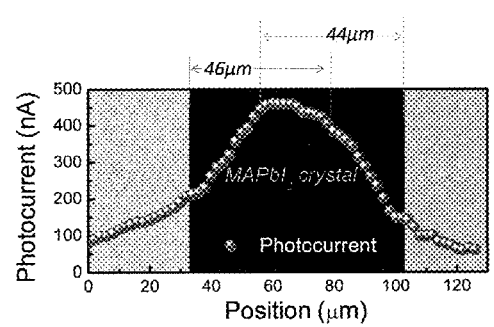

FIG. 14 shows photocurrent scanning across a $MAPbI_3$ lateral structure single-crystal device. FIG. 14A: Setup of photocurrent scanning, and FIG. 14B: Photocurrent scanning result measured as a function of the beam position scanning from anode to cathode of the MSC device.

DETAILED DESCRIPTION

Figure 1:
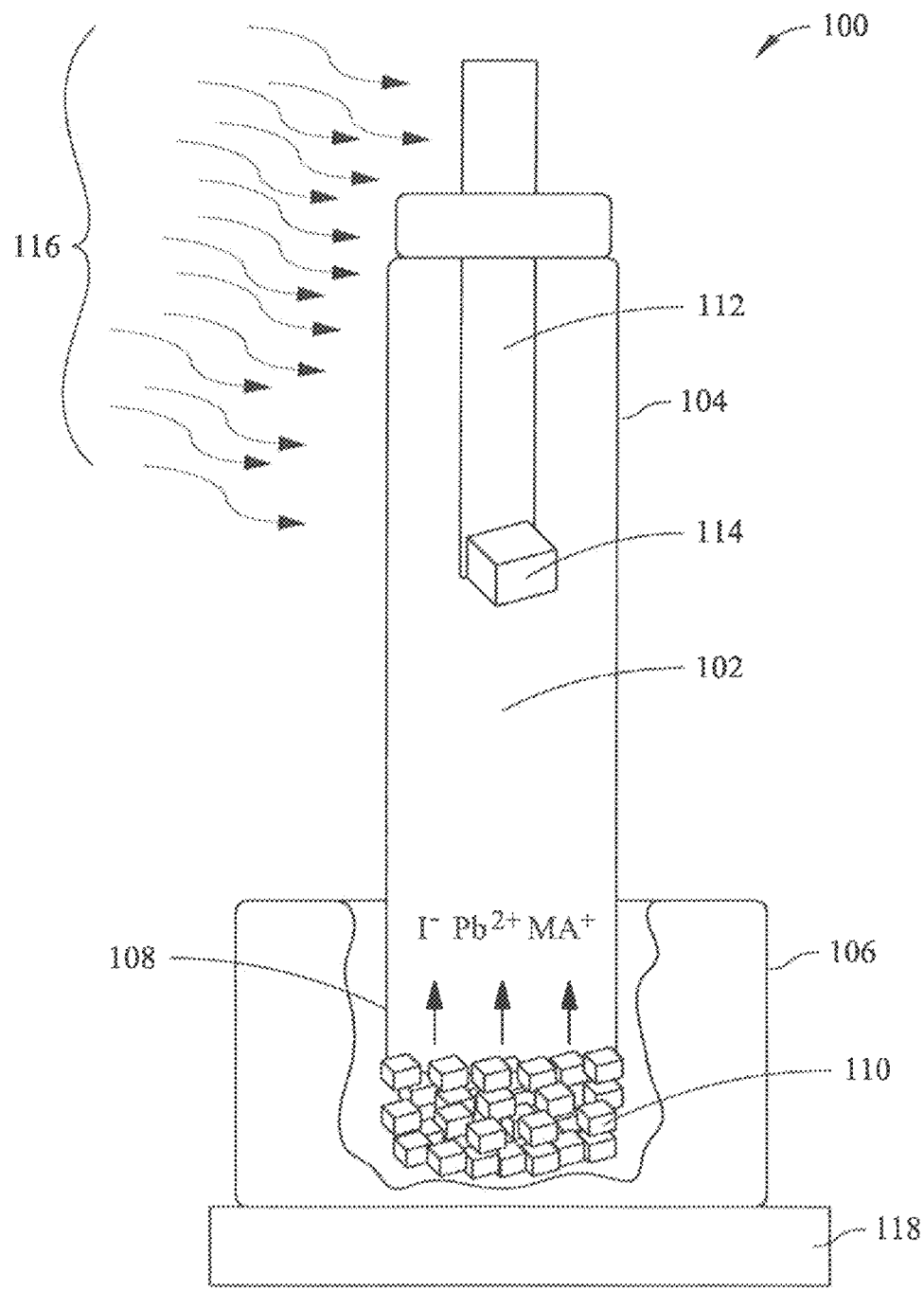
FIG. 1 is a cross-sectional side view illustrating of an apparatus for growing a large single perovskite crystal using a thermal gradient, according to an embodiment.
Figure 3:
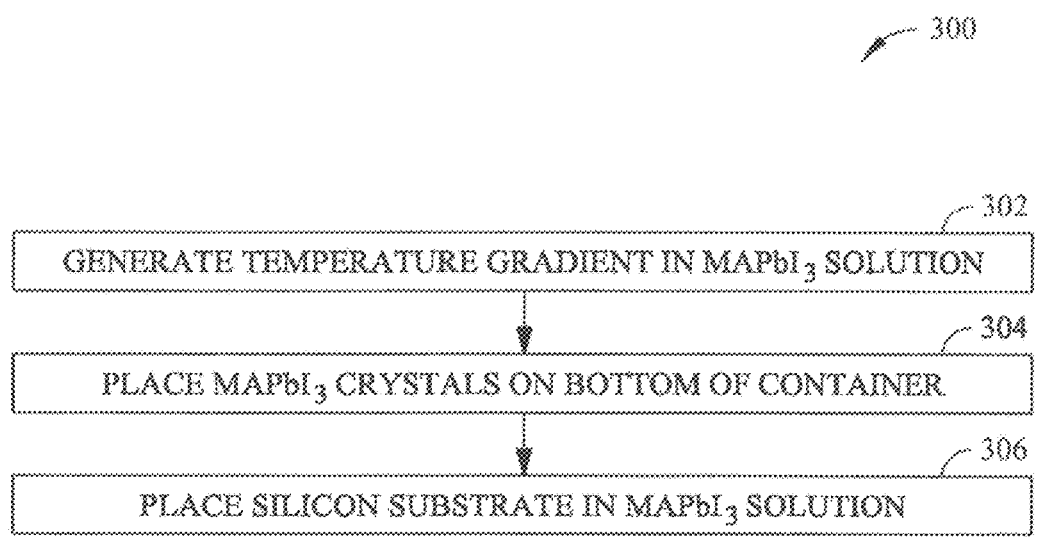
FIG. 3 is a flow diagram illustrating an embodiment of a process for growing a large single perovskite crystal, such as the large single perovskite crystals grown using the apparatus illustrated in FIG. 1.
Figure 4:
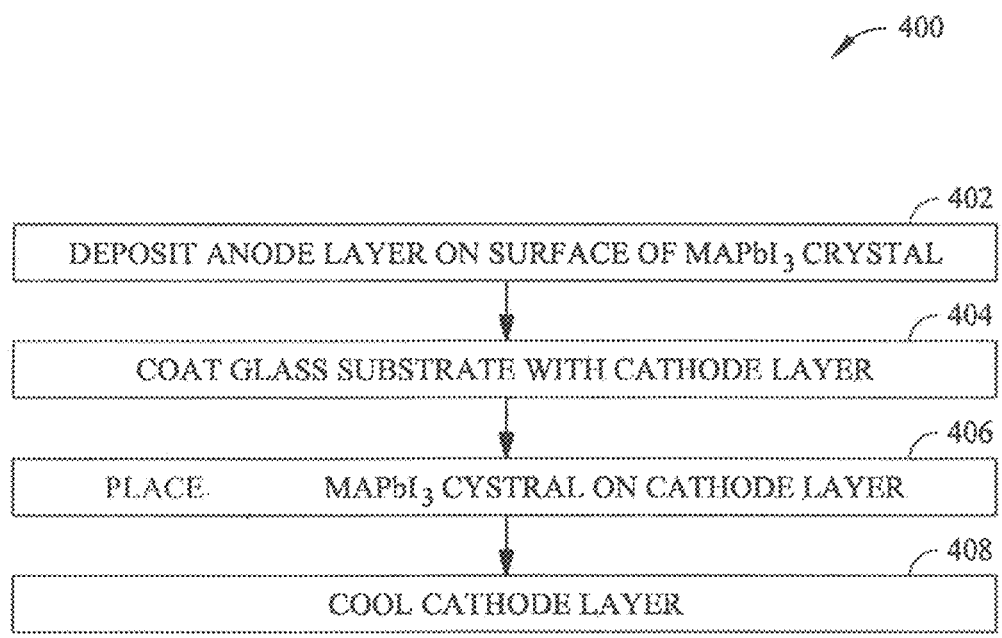
FIG. 4 is a flow diagram illustrating an embodiment of a process for fabricating a $MAPbI_3$ crystal semiconductor device using a large MAPbI3 crystal grown using the apparatus illustrated in FIG. 1.

FIG. 1 illustrates a perovskite single crystal growth for growing large perovskite (e.g., $MAPbI_3$) crystals according to an embodiment. Devices fabricated or grown using apparatus may be used in a perovskite crystal voltaic device 200 (e.g., photovoltaic, gammavoltaic, etc.) according to an embodiment illustrated in FIG. 2. FIG. 3 illustrates an embodiment of a process 300 for growing a single crystal, e.g., a $MAPbI_3$ single crystal, using the perovskite single crystal growth apparatus 100 shown in FIG. 1. FIG. 4 illustrates an embodiment of a process 400 for fabricating a $MAPbI_3$ crystal semiconductor device, such as the perovskite crystal photovoltaic device 200 illustrated in FIG. 2.

Advantageously, the single crystal perovskite materials formed according to embodiments herein have long, balanced electron and hole diffusion lengths on the order of 3 millimeters or greater. Long, balanced electron and hole diffusion lengths greater than 100 nanometers in polycrystalline perovskite materials, e.g., $CH_3NH_3PbI_3$ ($MAPbI_3$), are important for highly efficient perovskite photoactive or photoresponsive devices, such as solar cells. Diffusion lengths in $CH_3NH_3PbI_3$ single crystals grown by a solution-growth method can exceed 175 micrometers under 1 sun illumination and exceed 3 millimeters under weak light for both electrons and holes. The internal quantum efficiencies approach 100% in 3 millimeter-thick single crystal perovskite solar cells under weak light. These long diffusion lengths result from greater carrier mobility, lifetime and dramatically smaller trap densities in the single crystals than polycrystalline thin-films.

FIG. 1 illustrates a perovskite single crystal growth apparatus 100 that uses a thermal gradient according to an embodiment. Perovskite single crystal growth apparatus 100 includes a heat source 118, such as an electric hot plate, a hot oil bath 106, and a container 104 that house or holds a perovskite precursor solution 102 (e.g., $MAPbI_3$ precursor solution). In the embodiment shown in FIG. 1, a temperature gradient can be generated within precursor solution 102 by heating the bottom (e.g., a bottom portion) of container 104 containing the precursor solution 102 in a hot oil bath 106 (which can be heated, for example, using heat source 118). Cooling, such as air-cooling (e.g., using air convection 116), the top (e.g., a top portion) of the container 104 enhances the temperature gradient within container 104. $MAPbI_3$ or powders of its precursor, such as PbI2 and MAI, or Small-sized (e.g., <1 mm) methylammonium halide (e.g., $MAPbI_3$) single crystals (MSCs) 110 can be placed within and/or on the bottom inside of the container 104 as raw materials to maintain precursor (e.g., $MA^+$, $Pb^{2+}$, and $I^-$) ion concentration for a saturated solution. The temperature gradient created within the precursor solution 102 within container 104 results in a top portion of the precursor solution 102 being cooler than a bottom portion of the precursor solution 102 and the top portion of the precursor solution 102 being supersaturated. A substrate 112, such as a silicon substrate (or other material having a sufficiently low thermal conductivity), can be placed in the top of the precursor solution 102 to provide a surface on which to grow single perovskite (e.g., $MAPbI_3$) crystals 114 from the supersaturated precursor solution. Nucleation and growth of crystal(s) on the substrate 112 can be facilitated by removing the latent heat through the substrate 112, which is air-cooled. During the crystal growth process, the small MSCs 110 disposed in the bottom portion of the container 104 and/or the precursor solution 102 dissolve, and the resulting ions diffuse to the cooler top region of the container 104 and precursor solution 102 to grow large MSCs (e.g., >3 mm). After all small crystal has been consumed, the large crystal may still grow because solution maybe still supersaturated. In some implementations, the growth rate of a single crystal 114 can be about 2 mm/day or greater at 75° C. In one embodiment, a grown $MAPbI_3$ crystal may have an average size of about 3.3 mm. In some embodiments, single $MAPbI_3$ crystals can reach 10 mm or larger.

Large-sized crystal 114 growth from a supersaturated perovskite (e.g., $MAPbI_3$) solution uses a top-seeded-solution-growth method with a temperature gradient. The small-sized crystals 110 at the bottom of the container maintained the precursor (e.g., MA+, Pb2+, and I−) ion concentration for a saturated solution and the cooler top half of the solution is or becomes supersaturated. The large crystals are grown by the consumption of small crystals in the bottom of the container. The small temperature difference from bottom and the top of the solution induces a small convection that is enough to transport the material to the large crystal(s). The as-grown perovskite crystal(s) 114 have an average size or dimension of 3.3 mm (e.g., 3.3 mm×3.3 mm×3.3 mm) and a largest size or dimension of ~10 mm.

Figure 2:
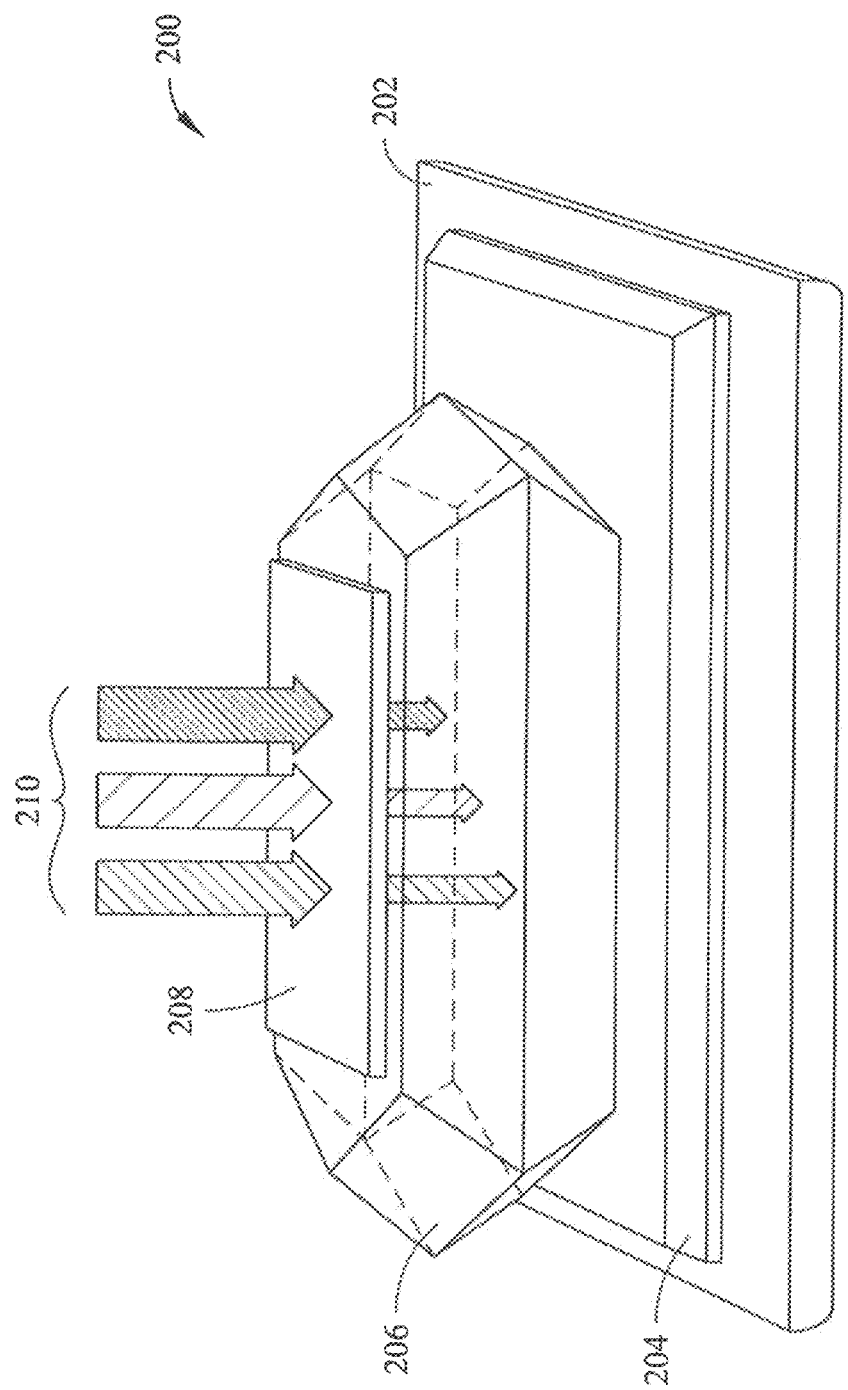
FIG. 2 is an isometric view illustrating of a perovskite crystal photovoltaic device with a perovskite crystal peeled from a large crystal grown using the apparatus illustrated in FIG. 1, in accordance with an embodiment.

FIG. 2 illustrates an exemplary embodiment of a perovskite crystal photovoltaic device 200 fabricated using a large perovskite (e.g., MAPbI$_3$) single crystal 206. The crystal 206 may be grown using the perovskite single crystal growth apparatus 100 shown in FIG. 1, or grown or formed by any other method. Perovskite crystal photovoltaic device 200 includes a glass substrate 202, a cathode layer 204, a perovskite layer (e.g., a MAPbI$_3$ crystal 206), and an anode layer 208.

As shown in FIG. 2, the perovskite crystal photovoltaic device 200 includes a cathode layer 204 and an anode layer 208. The cathode layer 204 functions as a cathode, which can include an electrode from which a conventional current leaves a polarized electrical device. The anode layer 208 functions as an anode, which can include an electrode through which positive electric charge flows into a polarized electrical device, such as the perovskite crystal voltaic device 200. In the embodiment shown in FIG. 2, a perovskite crystal photovoltaic device 200 includes a substrate 202, which can also include other substrates (e.g., a silicon layer) or combinations of substrates, a cathode layer 204 disposed on the substrate 202, a perovskite (e.g., MAPbI$_3$) crystal 206 that can be an as grown crystal or may have been peeled and/or separated from a large MSC, e.g., an MSC grown in the perovskite single crystal growth apparatus 100, and an anode layer 208 formed on at least one facet of the perovskite crystal 206. In this embodiment, the anode layer 208 and/or the perovskite crystal 206 are configured to receive energy 210 (e.g., light).

In a specific embodiment, anode layer 208 includes a semitransparent electrode, eg. 25 nm gold (Au), layer formed on one facet of a perovskite crystal 206. In this specific embodiment, cathode layer 204 includes a gallium (Ga) layer can be deposited on the glass substrate 202, where a facet of the perovskite crystal 206 opposite the facet with the gold layer contacts the cathode layer 204 including the gallium (Ga) layer. In this embodiment, the perovskite crystal 206 includes a thin MSC having a thickness in the range of approximately 100-200 μm, where the thin MSC can be peeled off from a large MSC, which can have a thickness of >3 mm. In this embodiment, the perovskite crystal photovoltaic device 200 may be illuminated from the semitransparent Au electrode side.

In one embodiment, an anode layer 208 (e.g., thin metal layer, carbon, graphene, nanostructure metal networks, ITO, IZO or FTO) can be configured to be disposed on the glass substrate 202, and the cathode layer 204 (e.g., thin metal layer, carbon, graphene, nanostructure metal networks, ITO, IZO or FTO) can be configured to be a top layer (e.g., distal from the glass substrate 202). The electrodes can also be modified by buffer layers such as PCBM, C60, C70, PTAA, PEDOT:PSS. In another embodiment, a device configuration can include a cathode layer 204 (e.g., ITO layer) disposed on glass substrate 202 and anode layer 208 (e.g., Ag layer) configured to be a top layer (e.g., distal from the glass substrate 202). In some embodiments, the bottom layer (e.g., proximate to the glass substrate 202) can function as a transparent electrode (e.g., an ITO layer), and the top layer (e.g., distal from the glass substrate 202) can function as an opaque electrode (e.g., an Al or an Ag layer).

In certain embodiments, the cathode layer 204 can include an aluminum layer and/or a silver layer that functions as a cathode, and the anode layer 208 can include an indium-tin oxide (ITO) layer that functions as an anode. In other embodiments, the cathode layer 204 can include an indium-tin oxide (ITO) layer that functions as a cathode, and the anode layer 208 can include an aluminum layer that functions as an anode. Other materials, e.g., with or without a buffer layer, may also be used to form the cathode layer 204, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials, e.g., Au/BCP/C60/PCBM hybrid layer, etc. Further, other materials may be used to form the anode layer 208 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. In some embodiments, the cathode layer 204 can be formed first (e.g., disposed on a glass substrate 202 or other substrate) while the anode layer 208 is formed last (e.g., a cathode layer 204 is formed on a glass substrate 202 and the anode layer 208 is formed last on a second buffer layer or perovskite crystal 206 layer). In another embodiment, the anode layer 208 can be formed first while the cathode layer 204 is formed last (e.g., an anode layer 208 is formed on a glass substrate 202 and the cathode layer 204 is formed last on a second buffer layer or perovskite crystal 206 layer).

In certain embodiments, the perovskite crystal photovoltaic device 200 includes an active layer, which can include a perovskite layer (e.g., MAPbI$_3$ crystal 206 layer). In implementations, the active layer serves to absorb light. In one specific example, an active layer can be configured to absorb light having a wavelength in a first predetermined range, and the anode layer 208 may be transparent to light having a wavelength in a second predetermined range, the second predetermined range overlapping the first predetermined range in a third predetermined range. In this specific example, the perovskite crystal photovoltaic device 200 may have a high resistivity when not illuminated by any light and may have a low resistivity when illuminated by light having a wavelength in the third predetermined range. In an embodiment, the active layer can include a perovskite layer (e.g., a halide perovskite device), which can function as a photovoltaic material and include a photovoltaic perovskite material. The perovskite layer can be disposed between the cathode layer 204 and the anode layer 208.

In certain embodiments, the perovskite layer can include a mixed perovskite single crystal that has been formed by the combination of solution-deposited lead (II) iodide (PbI$_2$) and methylammonium halide (CH$_3$NH$_3$X, where X can include Cl, Br, I, and/or a mixed halide). In other embodiments, the active layer can include at least one of polyvinyl carbazole (PVK), poly(3-hexylthiophene) (P3HT), poly [4,8-bis-(2-ethyl-hexylthiophene-5-yl)-benzo[1,2-b 4,5-b'] dithiophene-2,6-diyl]-a$_1$t-$_1$2-(2'-ethyl-hexanoyl)-thieno [3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b] thiophene) (PBTTT-C12), poly[2,7-(9,9'-dihexylfluorene)-alt-2,3-dimethyl-5,7-dithien-2-yl-2, 1,3-benzothiadiazole] (PFDDTBT), poly {[2,7-(9,9-bis-(2-ethylhexyl)-fluorene)]alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisD-MOPFDTBT), poly [N-9'''-hepta-decanyl-2,7-carbazole-alt-5,5-(4',7'-di-2-thienyl-2',1',3'benzothiadiazole)] (PCDTBT), and/or a combination of at least two of the above materials.

FIG. 3 illustrates an embodiment of a process 300 for growing a single large perovskite crystal using the perovskite single crystal growth apparatus 100 shown in FIG. 1. Specific reference will be made to a MAPbI$_3$ crystal, however, it should be appreciated that any perovskite crystal may be formed according to the process of FIG. 3. In step 302, a temperature gradient is generated in a MAPbI$_3$ solution in a container by placing a bottom container portion in a hot oil bath. In implementations, generating a temperature gradient can include generating heat using a hot plate 118 and/or a hot oil bath 106. Additionally, a MAPbI$_3$ solution 102 or other perovskite precursor solution may be prepared before step 302. In one specific example, preparing a MAPbI3 solution 102 can include dissolving Lead(II) acetate trihydrate (e.g., 29.3 g; e.g., 99%, Alfa Aesar) in Hydriodic acid (HI) (e.g., 100 ml; e.g., 57% w/w aq. soln., stab with 1.5% hypophosphorous acid, Alfa Aesar) in container 104. In this specific example, the container 104 can be placed into a hot oil bath 106 (e.g., 100° C.) to heat up the mixed acid solution. A blend solution of HI solution (e.g., 20 ml) and Methylamine (CH$_3$NH$_2$; e.g., 5.97 g; e.g., 40% w/w aq. soln., Alfa Aesar) can be added to the mixed acid solution. The temperature of the resulting mixed solution can be decreased (e.g., to 75° C.) and maintained (e.g., for one day) in order to precipitate small MSCs (e.g., less than 1 millimeter). The resulting solution can be transferred to a container as the MAPbI$_3$ solution 102 for growing large MAPbI$_3$ crystals (e.g., greater than 3 millimeters). In this specific example, the small MSCs 110 can be washed by diethyl ether and dried in vacuum as raw MSC materials.

In optional step 304, at least one small MAPbI$_3$ single crystal is placed on the bottom of the container 104. In certain embodiments, the at least one small MAPbI3 single crystal can include the raw MSC materials described above. In a specific example continued from above, raw MSC materials can be placed and/or transferred to the bottom (e.g., a side proximate to the hot oil bath 106 and/or the hot plate 118) of the container 104. Placing and/or transferring may include using an automated device for placing the MSC crystals in the container 104. In another embodiment, no crystal is placed in the container 104, e.g., the solution may be sufficiently saturated.

In step 306, a silicon substrate is placed in the MAPbI$_3$ solution, wherein a top portion of the container is air cooled and creates at least one large MAPbI$_3$ crystal on the silicon substrate. In certain embodiments, the silicon substrate 112 can include silicon and/or a substrate including material other than silicon that is suitable for growing crystals thereon. In a continuing specific example, a silicon substrate 112 can be inserted into the top of the container 104 and into the MAPbI$_3$ solution 102. The nucleation of MSCs on the silicon substrate 112 may be facilitated by removal of the latent heat through the air-cooled silicon substrate 112 on the top half of the container 104 to form large size, less dense crystal seed. The bottom of the container 104 can be kept in a hot oil bath 106 (e.g., 75° C.) to maintain a relatively high temperature and temperature gradient for the growth of MSCs. In some specific embodiments for facilitating large MSC growth, only one seed crystal may be kept on the silicon substrate 112 while all other crystals may be removed, which may allow growth of a larger crystal. In some instances, MSC growth rate can be about 2 mm per day or greater. Subsequent to MAPbI3 crystal growth on the silicon substrate 112, the MSCs can be washed (e.g., using diethyl ether) and can be dried (e.g., in vacuum) before use. The resulting crystals may be stable in air and may maintain a metal-like shining surface.

FIG. 4 illustrates an example process 400 for fabricating a MAPbI$_3$ crystal semiconductor device using a MAPbI$_3$ crystal layer from a single large MAPbI$_3$ crystal using the perovskite single crystal growth apparatus 100 shown in FIG. 1 and the process shown in FIG. 3, such as the perovskite crystal photovoltaic device 200 illustrated in FIG. 2. Although specific reference is made to MAPbI$_3$ in the following examples, it should be appreciated that other perovskite crystals are contemplated, e.g., other methylammonium halide based perovskite structures or materials.

In step 402, an anode layer is deposited on a surface of a thin MAPbI$_3$ crystal. In certain aspects, the thin MAPbI$_3$ crystal is as grown, peeled or cleaved or otherwise separated from a large MAPbI$_3$crystal, e.g., a MAPbI$_3$ crystal formed by the embodiments described herein. In some embodiments, a thin MAPbI$_3$ crystal (e.g., <200 µm) can be formed by using a blade to peel off a portion of at least one single large MAPbI$_3$ crystal (e.g., >3 mm). In a specific embodiment, a thin MAPbI$_3$ crystal can be about 100-200 µm thick. In certain aspects, depositing an anode layer 208 can include utilizing known deposition processes, such as chemical vapor deposition and/or sputtering techniques. The anode layer 208 may be deposited on at least one facet of the thin MAPbI$_3$ crystal. In a specific example, depositing an anode layer 208 can include depositing at least one gold (Au) layer (e.g., 25 nm) on one crystal facet, for example using thermal evaporation or sputtering.

In step 404, a substrate 202 (e.g., glass substrate) is coated with a cathode layer 204. In certain aspects, coating a substrate 202 with a cathode layer 204 can include using a known deposition process, such as sputtering, gold plating, and/or other deposition techniques depending on the cathode material used. In a specific example, coating a substrate 202 can include coating the substrate 202 with a cathode layer 204 including metallic melted gallium (e.g., at about 50° C.) using a doctor blade coating process.

In step 406, the cathode is deposited on MAPbI3 crystal or MAPbI$_3$ crystal is placed on the cathode layer. In certain aspects, one or more single MAPbI$_3$ crystals 206 can be placed on the cathode layer 204 (e.g., where a facet of each MAPbI$_3$ crystal opposite the facet with the anode layer 208 contacts the cathode layer 204). In a specific embodiment continued from above, single MAPbI$_3$ crystal(s) 206 can be transferred onto the cathode layer 204, which can be in the form of liquid gallium, Indium or InGa alloy. It should be noted that the anode layer formed in step 402 may be formed after the cathode layer has been formed and the crystal placed on the cathode layer.

In step 408, the cathode layer is cooled. Cooling the cathode layer 204 serves to solidify the liquid gallium. In certain aspects, with gallium as the cathode layer 204, cooling the cathode layer 204 can include cooling a liquid gallium layer to less than 20° C. Other materials may be utilized for forming the cathode layer 204, and other cooling temperatures may be used depending on the cathode layer 204 material used.

Some processes can include a method for forming continuous and/or compact lead iodine perovskite (MAPbI$_3$) films by the interdiffusion of formed and/or spin-coated layers of stacked PbI$_2$ and methylammonium halide. The resulting high quality perovskite films allow the fabrication of leakage-free photovoltaic devices and a high PCE of 15-17%. A lead iodine (PbI$_2$) layer can be formed on a cathode layer, and a methylammonium halide (MAH) layer can be formed on the lead iodine layer. In other embodiments, perovskite precursors (e.g., methylammonium iodide (MAI) and PbI$_2$) can be pre-mixed prior to applying and/or spin-coating the perovskite film on a first buffer layer, a cathode layer 204, and/or an anode layer 208. It is contemplated that other lead-based layers can be formed (e.g., PbX$_2$, where X can be Br, Cl, I, etc.). In a specific embodiment, PbI$_2$ and MAI can be dissolved in dimethylformamide (DMF) and 2-propanol, respectively, as precursor solutions at varied concentrations. The respective precursor solutions can then be formed, deposited, and/or spun onto a substrate, such as a glass substrate 202 and/or a first buffer layer. In some implementations, the substrate 202 can include a first buffer layer, such as poly(3,4-ethylenedioxythiophene) poly (styrenesulphonate) (PEDOT:PSS). Additionally, the substrate 202 may be covered with a cathode layer 204, such as indium tin oxide (ITO). In certain aspects, the substrate 202 may include an anode layer 208 instead of a cathode layer 204, such as an aluminum layer. In certain aspects, the PbI$_2$ layer can be formed first and disposed under the MAI layer. In certain aspects the MAI layer may be formed first and disposed under the PbI$_2$ layer. In some embodiments, a supersaturated hot solution of PbI$_2$ may be used for quick drying to obtain a pin-hole free and conformal PbI$_2$ layer on a PEDOT:PSS layer and/or a glass substrate 202. Since PbI$_2$ has relatively low solubility in 2-propanol, the spin-coating of MAI will not wash off PbI$_2$.

In one embodiment for forming a lead iodide (PbI$_2$) layer and a methylammonium halide layer, a precursor (e.g., CH$_3$NH$_3$I) is synthesized. In a specific example, a concentrated aqueous solution of hydroiodic acid (HI) (e.g., 15.0 mL, 57 wt % in water) can be reacted with methylamine (CH$_3$NH$_2$) (e.g., 13.5 mL, 40 wt % in aqueous solution) at 0° C. for 2 hours with constant stirring under a nitrogen atmosphere. Methylammonium can be crystallized by removing the solvent using a rotary evaporator. In this specific example, the resulting white powder can be washed with diethyl ether three times and dried in a vacuum overnight.

In a specific embodiment (e.g., for fabricating a solar cell), PbI$_2$ and/or MAI can be dissolved in DMF and 2-propanol with varying concentrations from about 130 mg/ml to about 450 mg/ml for PbI$_2$, and from about 17.5 mg/ml to about 50 mg/ml for MAI, respectively. In another specific embodiment (e.g., for fabricating a photodetector), concentrations can include about 400-800 mg/ml for PbI$_2$ and about 15-60 mg/ml for MAI. In certain aspects, the CH$_3$NH$_3$X and PbX$_2$ precursor mixture solutions in dimethylformamide (DMF) can include varied PbI$_2$/CH$_3$NH$_3$I precursor molar ratios (defined as a precursor ratio) from about 0.35 to about 1.5. The thickness of the CH$_3$NH$_3$PbI$_3$ films (e.g., from about 80 nm to about 5,000 nm) may be determined by varying the concentration of the precursor solutions. In one specific example, the precursor solutions can have a precursor ratio between about 0.5 and about 0.9, which can result in an iodine perovskite thickness of between about 200-500 nm. In some embodiments, a thicker perovskite film of about 1,000-8,000 nm may be used for mixed halide perovskites. In some implementations, the temperature of the precursor solution(s) can be generally above room temperature. A high concentration precursor solution may be used to form a relatively thicker perovskite film.

In this specific embodiment, both solutions can be heated at about 100° C. for approximately 10 min before use to ensure that both the MAI and PbI$_2$ can be fully dissolved. The PbI$_2$ solution can be formed and/or spun on a PEDOT:PSS layer or other substrate at about 70° C. at 6,000 round per second (rpm) for 35 seconds. Then, the PbI$_2$ film can be quickly transferred onto a hot plate and dried at about 70° C. The MAI solution can be spun on top of the dried PbI$_2$ film at 6,000 rpm for 35 seconds at room temperature in order to form a film with thickness ranging from about 70-320 nm. The MAI layer thickness may depend on the precursor solution concentration as well as the thickness of the underlying PbI$_2$ layer. The spin coated PbI$_2$ and MAI stacking films may then be dried at about 100° C. from one to three hours. In this specific implementation, a PCBM layer (e.g., dissolved in Dichlorobenzene (DCB), 2 wt. %) may be spun on the formed perovskite layers after cooling to room temperature.

The lead iodine layer and the methylammonium halide layer can then be annealed to form an interdiffused perovskite layer. In certain aspects, the PbI$_2$ and MAI layers can be solvent annealed and/or thermally annealed for varied durations. In one example of thermal annealing, the PbI$_2$ and MAI layers can be annealed (e.g., at a temperature of about 80-120° C. for about 30-180 mins). In a specific example of solvent annealing, about DMF solvent (e.g., about 10 μL) can be added proximate to the PbI$_2$ and MAI layers during the thermal annealing process such that the DMF vapor can contact the perovskite layer. The DMF vapor will penetrate into the perovskite film and facilitate the growth of crystalline domains. The resulting annealed perovskite layer is generally continuous and pinhole-free across the whole surface. In contrast, bilayer MAPbI$_3$ films formed and spun from premixed PbI$_2$ and MAI blend solutions generally may be non-uniform with many microstructures on the surface. In one specific embodiment, a PbI$_2$, MAI, and PCBM layer can be annealed (e.g., at 100° C. for one hour) to let the PCBM crystallize and/or diffuse into a resulting perovskite layer. In another specific embodiment, a mixed halide perovskite layer may be annealed for about 2 hours. The perovskite layer may be finished forming additional layers (e.g., a second buffer layer, a trapping layer, etc.). In a specific example, a fullerene layer can be formed using thermal evaporating (e.g., C$_{60}$ (20 nm), BCP (8 nm)).

An anode layer can be formed on the perovskite layer. In certain aspects, the anode layer can be formed on the perovskite layer, second buffer layer, and/or trapping layer using processes such as physical vapor deposition or other known deposition processes. In a specific embodiment, an aluminum anode can be formed to a thickness of about 100 nm. In another specific embodiment, the perovskite crystal photo voltaic device 200 area, defined as the overlap of the cathode layer 204 (e.g., ITO) and anode layer 208 (e.g., an aluminum electrode), can be between about 2 mm$^2$ and 10 mm$^2$ or greater (e.g., about 6 mm$^2$).

FIGS. 5 through 8 illustrate a lateral structure device 500, multiple tandem solar cell devices including at least one lateral structure device 500, and a method 900 for fabricating the lateral structure device 500. As shown in FIGS. 5A and 5B, a lateral structure device 500 can include a single perovskite crystal 506, and at least one electrode 504 (as shown in FIG. 5A), or a lateral structure device 500 can include a substrate 502, at least one electrode 504, and a single perovskite crystal 506 (as shown in FIG. 5B). In certain aspects, substrate 502 can include any substrate suitable for supporting a desired structure.

Figure 5A:
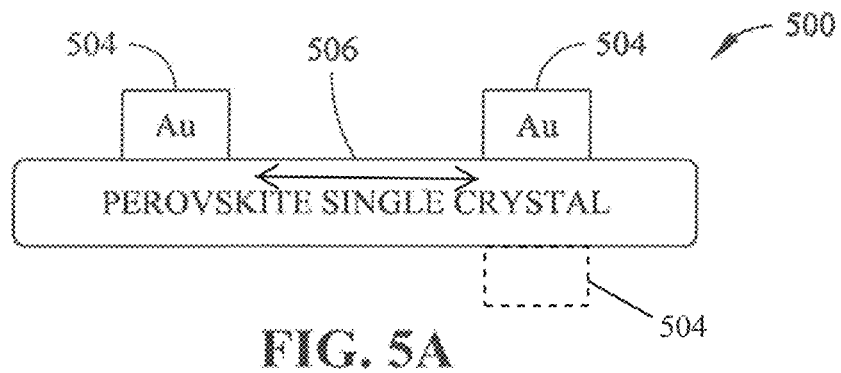
FIG. 5A and FIG. 5B are side cross section views illustrating embodiments of a lateral single crystal device.
Figure 5B:
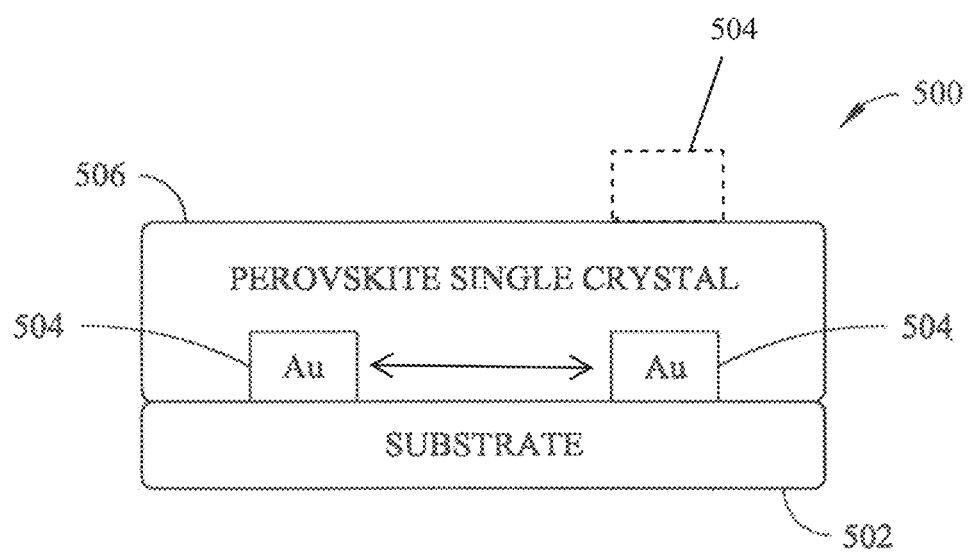

A single perovskite crystal 506 can be grown with different methods, including the methods as described herein or other solution-process methods, electric-deposition methods, or CVD methods. In the embodiments shown in FIG. 5A, a lateral structure device 500 includes a perovskite single crystal 506 layer and two patterned electrodes 504 and 504$_1$ (e.g., gold (Au)) disposed on the perovskite single crystal 506. As shown, the electrodes 504 and 504$_1$ are disposed on the same side of the crystal 506. In an alternate embodiment, electrode 504$_1$ may be disposed on an opposite side of the crystal 506 as shown by the dotted line 504$_1$. In both lateral device embodiments shown by FIG. 5A, charge flows along a plane defined by the crystal 506 from one electrode to the other electrode, e.g., in a horizontal direction as shown in FIG. 5A, rather than in a vertical direction as would occur in the device shown in FIG. 2. In the embodiments shown in FIG. 5B, a lateral structure device 500 include a substrate 502, two patterned electrodes 504 and 504$_1$ (e.g., gold (Au)) on the substrate 502, and a perovskite single crystal 506 formed over the electrodes 504, 504$_1$ and the substrate 502. In these embodiments, the patterned electrodes 504 and 504$_1$ may be formed on the top or bottom surface of the substrate 502 and/or the perovskite single crystal layer 506. Additionally, the perovskite single crystal 506 may be grown in-situ on the electrodes 504, 504$_1$. As shown, the electrodes 504 and 504$_1$ are disposed on the same side of the crystal 506. In an alternate embodiment, electrode 504$_1$ may be disposed on an opposite side of the crystal 506 as shown by the dotted line 504$_1$. In both lateral device embodiments shown by FIG. 5A, charge flows along a plane defined by the crystal 506 from one electrode to the other electrode, e.g., in a horizontal direction as shown in FIG. 5A, rather than in a vertical direction as would occur in the device shown in FIG. 2. In certain embodiments, a lateral p-i-n structure can be formed by applying an electric field. In certain aspects, diode and photocurrent directions of a lateral structure device 500 device can also be switched with an electric field. A lateral structure device 500 can be sensitive to the surface of a perovskite crystal or film. Further optimization of a lateral structure device 500 may include surface passivation, which can decrease the surface trap density and enhance the device efficiency. Additional aspects and advantages regarding lateral structure photoactive devices using single crystal perovskite materials such as single crystal organometal trihalide perovskites (OTPs) and other perovskite materials is discussed below, The ultra-long carrier diffusion length on the order of 3-30 mm for the materials and devices formed according to embodiments herein also enables new lateral structure device 500 designs based on lateral single crystal devices (e.g., solar cells). Because no transparent electrodes or opaque back electrodes are required in a lateral structure device, one or more perovskite devices can be used for a tandem structure device, which may serve to avoid light loss and result in higher efficiency.

FIG. 6 shows an embodiment of a lateral structure device 500 combined with a photoactive device 508. Lateral structure device 500 includes a perovskite layer 506 and electrodes 512. In this embodiment, a lateral structure device 500 including a perovskite can be combined with a silicon-based solar cell 508 or other photoactive device. Photoactive device 508 may include a silicon solar cell, CIGS, CdTe, organic, perovskite or other high efficiency vertical structure low bandgap solar cell. In this configuration, no current match is needed between cells/devices, and each individual cell/device can be optimized. The bandgap between the top cell/device and the bottom cell/device should be matched for maximizing efficiency.

Figure 7:
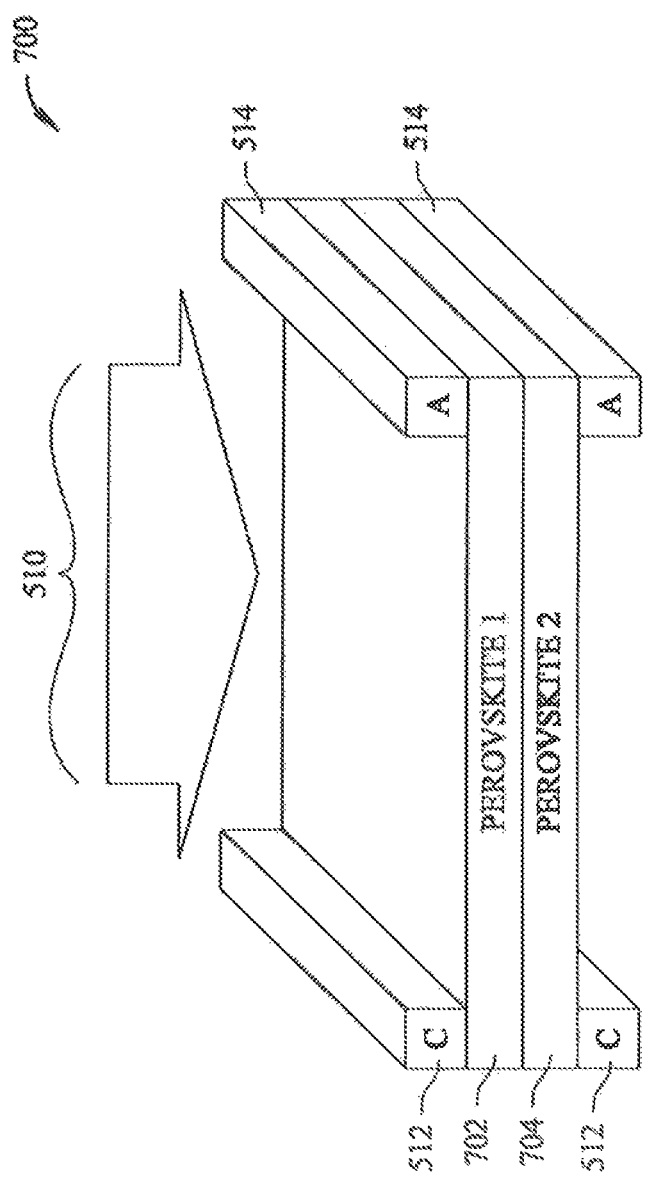
FIG. 7 is an isometric view illustrating of a multiple tandem solar cell device including two lateral single crystal devices according to an embodiment.
Figure 8:
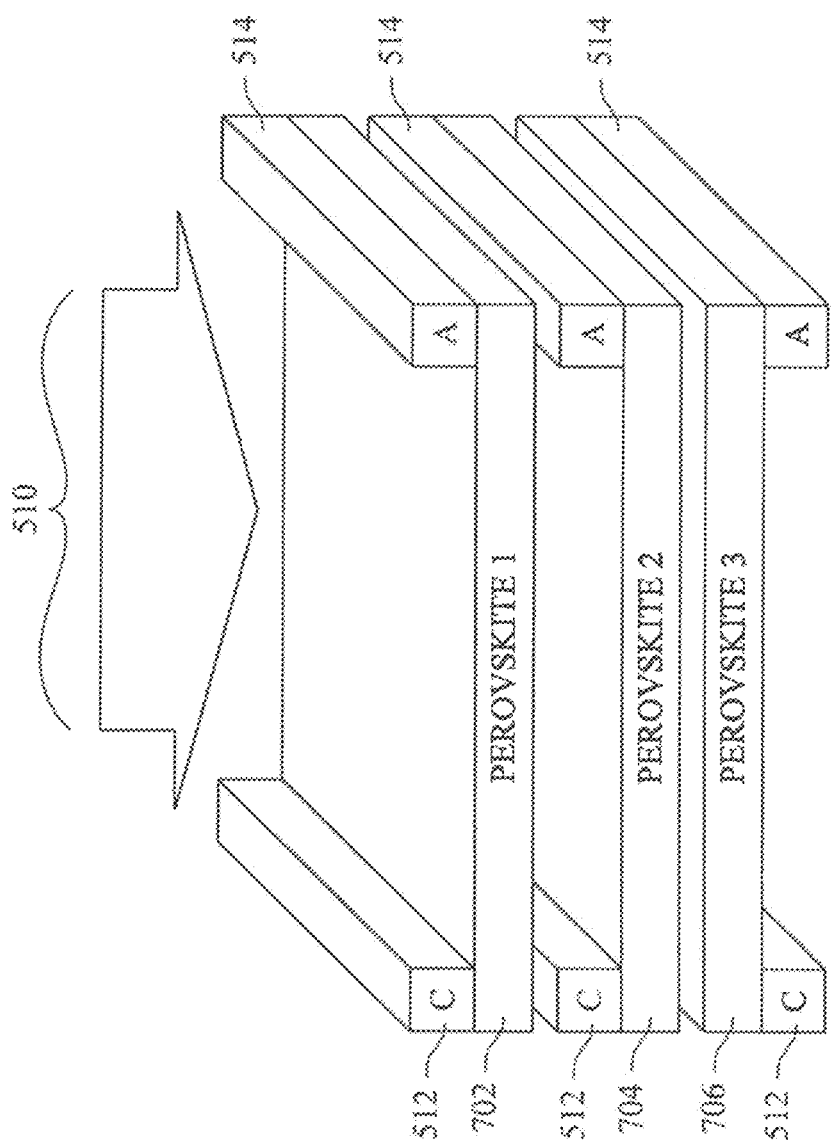
FIG. 8 is an isometric view illustrating of a multiple tandem solar cell device including three lateral single crystal devices according to an embodiment.
Figure 9:
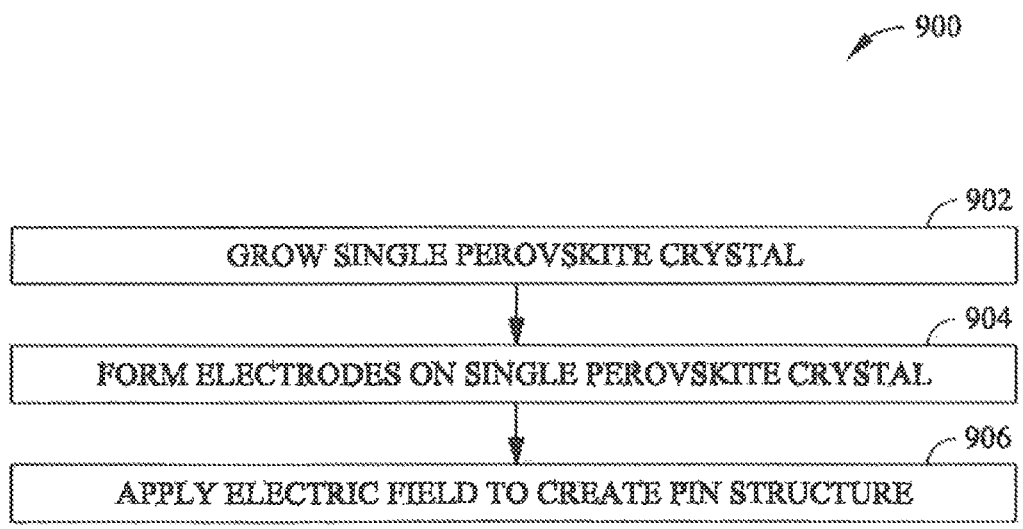
FIG. 9 is a flow diagram illustrating an embodiment of a process for fabricating a lateral single crystal device, such as the devices shown in FIGS. 5A and 5B.

FIGS. 7 and 8 show multiple combined lateral structure devices 500 according to embodiments. The perovskite materials in each of the devices combined to form the combined devices may be the same in each device or they may be different in each of the devices (e.g., Perovskite 1 may be the same as, or different from, Perovskite 2 in FIG. 7). In the embodiment shown in FIG. 7, a first perovskite cell 702 can be combined with a second perovskite cell 704 in a tandem configuration. In the embodiment shown in FIG. 8, a first perovskite cell 702 can be combined with a second perovskite cell 704 and a third perovskite cell 706 in a tandem configuration as shown. In these configurations, no current match is needed between the first perovskite cell 702, the second perovskite cell 704, and/or the third perovskite cell 706 and each individual cell can be optimized. The bandgap between the cells may be matched to maximize efficiency.

The configuration of lateral-structure solar cells facilitates vertical stacking of sub-cells with complimentary absorption spectra to capture sun light with a wider wavelength range. However, the carrier diffusion lengths in the polycrystalline OPTs are still too small to yield efficient lateral-structure OPT solar cells due to the strong scattering of charge carriers at the grain boundaries. The highest power conversion efficiency obtained with polycrystalline lateral-structure OTPs was below 0.1%. The development of very long carrier diffusion length (e.g., >175 micrometers (μm)) in single-crystalline perovskites, such as methylammonium lead triiodide (MAPbI$_3$), and other materials, according to the embodiments herein, provides a new opportunity to revisit the lateral-structure device as a means to achieving high efficiency in OTP solar cells.

According to various embodiments, hybrid perovskite photoactive devices such as solar cells can be fabricated with a lateral structure using OTP single crystals, which eliminates the need for transparent electrodes. Replacing the polycrystalline OTP thin films with the single crystals yields an efficiency enhancement (e.g., up to 44 fold or greater), enabled by much longer carrier diffusion lengths in the OTP single crystals which allow the charges to be efficiently collected along the lateral direction. A strong piezoelectric effect is observed in OTP single crystals, which enables the poling of the single crystals under nonuniform electric field according to certain embodiments. The strain-generated grain boundaries provide paths for the ion migration to form a p-i-n structure.

The photovoltaic devices according to various embodiments have a lateral structure of electrode/perovskite single crystal/electrode, and may be fabricated by depositing two parallel electrode on one facet of the single crystals (e.g., MAPbI$_3$ single crystals or MSCs). The electrode materials could be varied conductive materials such as carbon, Gold (Au), etc. which do not react with the OTP. A metal with buffer layer (electron or hole transport layer), eg. Copper (Cu) with Poly[bis(4-phenyl)(2,4,6-trimethylphenyl)amine] (PTAA) or [6,6]-Phenyl C61 butyric acid methyl ester (PCBM), could also be used as electrodes in lateral-structure devices which extend the candidates of electrodes materials with further reduced cost. According to certain aspects, gold is used as the electrode because of the higher stability of Au on perovskite during different measurement. For one embodiment, with a structure of Au/MAPbI$_3$/Au, there was negligible photovoltaic effect for the as-prepared devices with the symmetrical Au electrodes. It has been established previously that an electrical poling is required to break the electrode symmetry so that a p-i-n structure, induced by ion migration and self-doping, can be formed. Nevertheless, the grain boundaries might be the dominating path for ion migration under the applied field in the OTP polycrystalline thin films, because the energy barrier for ion migration within the grain boundaries is half as large as compared to in the bulk. This imposes a fundamental challenge for the poling of single-crystal OTPs devices because of the absence of grain boundaries in them.

Interestingly, the OTP single crystals of the present embodiments showed strong piezoelectric effect, which enables the electrical poling of OTP single crystals and thus enables the p-i-n structure formation. The piezoelectric effect is a reversible process exhibiting both the direct piezoelectric effect (electrical charges generated by an applied mechanical force) and reverse piezoelectric effect (mechanical strain response to an applied electrical field). To verify the piezoelectric effect, a single-crystal device with a different vertical structure was fabricated, i.e. a MAPbI$_3$ single crystal sandwiched by two electrodes on two parallel facets of the crystals as shown in FIG. 10A. This device showed positive and negative voltage pulse when it was squeezed and released by simple striking it gently (FIG. 10B), providing a direct evidence for the presence of piezoelectric effect in MAPbI$_3$ single crystals. Such a phenomenon in a reference device based on MAPbI$_3$ polycrystalline thin film was not seen with the same test conditions as single crystal devices. This is possibly due to the random distribution of grain orientation in polycrystalline films, which indicates a single crystal is critical for the piezoelectric property measurement. As the laser interferometry method has been proved to be reliable and high in accuracy from previous piezoelectric coefficient measurement, for the single crystal sample, a high-resolution Mach-Zehnder interferometer was adopted to record the crystal shape change under an applied alternating electric field in the range of 1 kV/m to 20 kV/m for piezoelectric coefficient measurements, with the setup shown in FIG. 10C. The measured piezoelectric coefficient ($d_{33}$) is 2.7 pm/V along [001] direction (FIG. 10D), with no observable electrostriction effect for the MAPbI$_3$ single crystals.

FIG. 11A shows an image of a lateral-structure MAPbI$_3$ single-crystal device. Since the electric field applied in the lateral-structure devices was non-uniform, with a higher field close to the electrode region as illustrated in FIG. 11B, the field-induced strain was highly non-uniform. The non-uniform crystal strain in the lateral-structure devices caused a crystal-plane displacement when the applied electric field reached 1 V/μm, as shown in FIG. 11C and FIG. 11D. The poling process of the lateral-structure MAPbI$_3$ single crystal device with the poling bias switched on and off for multiple cycles, may revealed the distortion of the crystal surface caused by the non-uniform field. A dense array of stripes appears upon the application of a poling bias of 50 V on Au electrodes (FIG. 11E) and disappears after turning off the applied poling bias (FIG. 11F). During the poling of the MAPbI$_3$ single crystal under a relatively high poling field of 1 V/μm, two sets of parallel strip lines showed up on the surface of the MAPbI$_3$ single crystal, which is likely formed by the slipping of the weakly bonded (100) planes with respect to each other to relieve the accumulated strain. Although the crystal recovered its shape in macroscopic scale after turning off the applied bias, there should be defects generated in the crystal during the poling process. The slipping-generated interfaces/grain boundaries and dislocation lines are proposed to provide a high-speed channel for the ion migration under the electric field, resulting in the formation p-i-n structure by the ion doping.

The p-i-n or n-i-p doping can be tuned by changing the poling direction. The formation of reversible p-i-n structure may be induced by ion drift under applied electric field in the perovskite layer. The direction of ion migration can be controlled by the direction of applied electric field for the formation of p-i-n or n-i-p doping. FIG. 12A shows the typical switchable photovoltaic behavior of a lateral Au/MSC/Au device. The open-circuit voltage ($V_{OC}$) direction was in agreement with the poling bias direction. The much longer diffusion length in the MAPbI$_3$ single crystals than in polycrystalline thin films resulted in much more efficient charge collection. FIG. 12B shows the photocurrents of a MAPbI$_3$ lateral-structure single-crystal device and a lateral-structure polycrystalline thin film device with the same electrode spacing of 50 μm under white illumination with an intensity of 25 mW/cm$^2$ (0.25 sun). The Polycrystalline thin film and device was fabricated on glass substrate by the interdiffusion method and the film was continues and had full coverage. The MAPbI$_3$ lateral-structure single crystal device showed a $J_{SC}$ of 2.28 mA cm$^{-2}$ (FIG. 12B), which is about 33 times larger than that of the lateral-structure polycrystalline devices. And the $V_{OC}$ increased significantly from 0.61 V for the thin-film device to 0.82 V for the single crystal device. The normalized EQE curve of MSC lateral structure device shown in FIG. 12C shows a significant extension of the cutoff to ~850 nm, in contrast to the cutoff of 800 nm from MAPbI$_3$ thin film devices, which is in consistent with the result in vertical-structure single-crystal device. It is likely caused by the below bandgap absorption which only becomes significant in the very thick single crystals, which can potentially boost the $J_{SC}$ upper limit of the MAPbI$_3$ single crystal based solar cells.

The $V_{OC}$, short circuit current density ($J_{SC}$) and power conversion efficiency (PCE) of the MAPbI$_3$ lateral-structure single-crystal device is strongly temperature dependent. As shown in FIG. 12C, a highest PCE of 5.36% is reached at 170 K for the lateral-structure single crystal device, with a high $J_{SC}$ comparable to the best thin-film solar cells under the same light intensity. The $J_{SC}$ increased when the temperature was reduced from 250 K to 170 K, which should be ascribed to the enhanced carrier mobility and reduced charge recombination rate at lower temperatures. There was a sharp transition of $J_{SC}$ variation trend at 170 K, which corresponds to crystal phase transformation from tetragonal to orthorhombic. The $J_{SC}$ decreased at further reduced temperature from 170 K to 77 K. The different trends of $J_{SC}$ variation with temperature across the phase transformation temperature may be related to the exciton dissociation efficiency. It was reported that exciton screening effect by collective orientational motion of the organic cations in the tetragonal phase leads to the easy dissociation of the excitons into free carriers. In the orthorhombic phase, the motion of organic cations is restricted and bound-exciton forms, resulting in the decreased $J_{SC}$ at lower temperature. However more study is needed to find out the exact mechanism. The $V_{OC}$ of lateral-structure single-crystal device reached 0.8-0.9 V, which is the same as previously reported lateral-structure polycrystalline devices without a hole transport layer. Optimization of the electrode material work function, as well as incorporation of electron/hole transport layers to achieve a better energy-level alignment should further increase the PCE and $V_{OC}$ of the lateral-structure single-crystal solar cells. The PCE of the lateral-structure device was 1.88% at room temperature, representing a 44-fold enhancement compared to the thin-film lateral-structure polycrystalline devices. The lateral-structure single-crystal devices showed a small photocurrent hysteresis with changed J-V scan rate and scan directions as shown in FIG. 13. The scan rate dependent hysteresis test was in time scale of minutes that is consistent with the stabilized photocurrent output of the device at the maximum power point ($J_{MPP}$). FIG. 13B shows the $J_{MPP}$ for a continuous testing over 1 hour. The value of $J_{MPP}$ rose to a peak value of approximately 1 mA cm$^{-2}$ in 2 min under 0.25 sun illumination at room temperature, and then reached a stable output of ~1 mA cm$^{-2}$ again after experiences a dip. The variation of photocurrent output can be possibly caused by the combination of trap filling process and ions redistribution driven by the photovoltage.

Photocurrent scanning was conducted on a MAPbI$_3$ lateral-structure single-crystal device with 70 μm electrodes spacing to evaluate the charge collection length in these single crystals. The much longer carrier diffusion length of the single crystal principally allows the using of focused laser beam instead of electron beam to locally generate the charges. The device was loaded onto a programmable X-Y position stage, and was illuminated by a focused 632 nm laser beam with a focused light spot size of approximately 1 μm on the MSC surface (FIG. 14A). FIG. 14B shows the relative photocurrent intensity by scanning laser spot across anode to cathode of the lateral-structure device. There is an increasing photocurrent toward the center, while there is a relatively flat region of photocurrent generated close to the center, where the photo-generated electrons and holes should be most efficiently collected by the cathode and anode with a good balance. A comparable electron or hole diffusion length of approximately 45 μm in the MAPbI$_3$ single crystals is reported here. The carrier diffusion length is smaller than expected because there are grain boundaries generated during electrical poling process which induce more defect than the single crystal before poling. However, the carrier diffusion length in poled single crystal is still much longer than polycrystalline thin films, so the charges can be collected in lateral direction. The poling induced crystal damage should be the main limitation of device performance for a lateral device, but at the same time it also indicates a way to further increase the efficiency of lateral-structured solar cell by minimize the damage to the crystal. For example, a p-i-n structure can be achieved by direct doping of OTP single crystal below the two electrodes, similar to the method of doping in silicon transistor fabrication. The PCE of 1.88% for lateral-structure single crystal solar cell at room temperature is still lower than the best vertical perovskite solar cell, but it is promising considering fact that the first perovskite solar cell was not efficient either.

In summary, the lateral-structure devices made from single perovskite crystals, e.g., solution-grown OTP single crystals, open a new route to fabrication of efficient low-cost solar cells or other photoactive devices with a simple device structure of Metal/Crystal/Metal. This innovation eliminates the need for more expensive and efficiency-reducing transparent electrodes. The transparent-electrode-free device structure also provides a new paradigm to enhance the light absorption efficiency in active layer. Intentionally doped perovskite layers at the cathode and anode sides, rather than those formed by electrical poling, should further increase the PCE of these lateral-structure single-crystal structure devices, because it will preserve the long carrier diffusion length of the single crystals. The demonstration of efficient lateral perovskite solar cells allows new design of tandem devices by integrating perovskite devices with other types of solar cells.

Example Methods

Device Fabrication and Characterization.

Single crystals were prepared by slowly cooling down the supersaturated MAPbI$_3$ precursor solution from 110° C. to 60° C. with a cooling rate of approximately 0.1-0.5° C./h. The precursor solution was prepared as previously reported. The resulted crystals were separated from mother solution, and then washed with diethyl ether and isopropyl alcohol. The lateral-structure single-crystal devices were fabricated by depositing parallel Au bar electrodes (75 nm thick) with varied spacing on one facet of the MSCs by vacuum thermal evaporation with shadow masks. For J-V test, both side of gap spacing on top crystal surface was covered by metal electrodes as a function of mask for accurate definition of device working area. The working area of MSC lateral solar cell was (50-100) μm×1000 μm. Then MSCs with Au electrodes were poled by applying 50-200 V bias for varied duration. The poling process and the following measurements on lateral-structure solar cells were conducted in a probe station chamber under a vacuum of 10$^{-5}$ Pa, under white light (25 mW cm$^{-2}$) through a quartz window. The temperature was decreased to 77 K and temperature dependent device performance was measured with slowly increased temperature to 350 K. N$_2$ atmosphere was used to protect the sample from moisture during current mapping measurement.

Piezoelectric Coefficient Measurement.

Two paralleled crystal facets were chosen to deposit Au electrode (75 nm) for the measurement. A collimated He—Ne laser beam (wavelength of 632 nm) with a spot size of ~2 mm came in perpendicular onto the crystal top (001) surface. The bottom crystal plane was glued to the sample holder which is fixed, while the top surface of the crystal could move freely. The thickness change under applied electric field was measured by the interferometer.

Radiation Detectors

In some embodiments, a perovskite crystal photovoltaic device 200 may be used as a radiation detector because of the following advantageous properties: a high density, e.g. about 4.24 g/cm$^3$; Pb, Br, I are high atomic number atoms with large stopping power; perovskites include nature abundant materials and have low manufacturing cost; defect tolerant capabilities enables high performance at low cost; no or small bias is needed; removing costs of high voltage bias circuit, miniature size; and the mobility lifetime product at zero bias is about 4-5 orders of magnitude higher than state-of-art semiconductor detector material such as CdZnTe, or CZT.

Current nuclear/radiological materials detection heavily relies on crystalline scintillators or semiconductors. Material defects and impurities are the main obstacles to reducing fabrication cost and improving spectroscopic performance in high-sensitivity radiation detectors. Reducing defects or impurities in most radiation materials is always preferred for high-performance radiation detectors, but the material cost is inevitably boosted dramatically by tedious purification and/or slow-growth techniques. Organometal trihalide perovskites (OTPs) can include a family of defect-tolerant materials that can serve as low-cost, high-performance radiation detection scintillators and semiconductors with the potential to significantly reduce the radiation detection material cost. The unusual defects physics in these materials enables excellent luminescence yield and long carrier diffusion length despite the presence of a large density of defects. The OTP crystals can be used for bothscintillators and semiconductor detectors, as well as x-ray and gamma-ray detection. OTPs grown by a low-cost solution growth process, e.g., processes described herein, have an advantageous carrier diffusion length of 3-30 mm at room temperature, which is the longest among any existing semiconducting materials. The mobility-lifetime ($\mu\tau$) product is more than $4\times10^5$ times larger than that of CdZnTe. In addition, OTPs have strong x-ray and gamma-ray stopping power due to the large density and large atomic number atoms of Pb and I. The operation of OTP devices in x-ray-voltaic or gamma-ray-voltaic mode can dramatically reduce material costs as well as system costs by removing the power source and high-bias circuit.

In certain embodiments, a single crystal perovskite device includes a single crystal perovskite with a cathode disposed on one side and an anode disposed on the opposite side. In a specific embodiment, the cathode and/or the anode can include a gold (Au) or other semitransparent electrode material. In some embodiments, a semitransparent hole transport layer (e.g., PEDOT:PSS, TPD and its derivatives, etc.) or an electron collection layer (e.g., dipole molecules, fullerene and its derivatives, etc.) can be inserted between an electrode and the perovskite layer. In an embodiment, a low work function metal (e.g., Ga or a modified metal such as PCBM/Au) can be used as a cathode. High work function materials (e.g., Au or Pt) can be used as an anode for single crystal perovskite devices.

U.S. application Ser. No. 14/576,878, filed Dec. 19, 2014, entitled "Photovoltaic Perovskite Material and Method of Fabrication," provides additional detail regarding device materials and processes and is hereby incorporated by reference herein for all purposes.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed:

1. A process for growing a perovskite single crystal, comprising:
    generating a temperature gradient of at least 20° C. in a perovskite precursor solution; and
    positioning a substrate in the precursor solution at a cooler portion of the perovskite precursor solution where the temperature is cooler than at a warmer portion of the perovskite precursor solution due to the temperature gradient, the substrate having a first end extending within the perovskite precursor solution toward the warmer portion of the perovskite precursor,
    wherein a perovskite single crystal nucleates and grows on the substrate proximal to the first end of the substrate to form a large-size perovskite single crystal.

2. The process of claim 1, further comprising cooling a distal end of the substrate external to the perovskite precursor solution.

3. The process of claim 1, wherein the perovskite precursor solution in the cooler portion is supersaturated.

4. The process of claim 1, wherein the precursor solution is contained within a container, wherein at least a bottom portion of the container is within a heated fluid bath, and wherein the at least one small perovskite crystal is placed proximal to the bottom portion of the container which corresponds to the warmer portion of the perovskite precursor solution.

5. The process of claim 1, wherein the warmer portion of the perovskite precursor solution is at a temperature of about 40° C. to about 200° C., and wherein the cooler portion of the perovskite precursor solution is at a temperature of about 20° C. to about 130° C.

6. The process of claim 1, wherein the perovskite single crystal is a perovskite having a structure of $AMX_3$, wherein A is methylammonium ($CH_3NH_3+$), Cs+ or formamidinum ($H_2NCHNH_2+$), M is a metal cation, and X is a halide anion thiocyanate (SCN—) or mixture of them.

7. The process of claim 4, further including placing at least one perovskite single crystal, or perovskite powders in the perovskite precursor solution at the warmer portion of the perovskite precursor solution where the temperature is higher than at the cooler portion of the perovskite precursor solution due to the temperature gradient.

8. The process of claim 6, wherein the metal cation is $Pb_2+$, and wherein the halide ion is one of I—, Cl—, Br— or a mixture thereof.

9. A perovskite crystal photovoltaic device having a lateral electrode structure, comprising:
a perovskite single crystal defining a planar perovskite layer;
a first electrode disposed on a first side of the planar perovskite layer; and
a second electrode disposed on the first side of the planar perovskite, wherein the second electrode is displaced from the first electrode along a planar direction defined by the planar perovskite layer, such that when activated by illumination impinging on the perovskite single crystal, a charge flows in the perovskite single crystal along the planar direction between the first and second electrodes.

10. The device of claim 9, wherein the perovskite single crystal has a structure of $AMX_3$, wherein A is methylammonium ($CH_3NH_3+$), M is a metal cation, and X is a halide anion.

11. The device of claim 9, wherein the first electrode and the second electrode are both non-transparent to the illumination impinging on the perovskite single crystal.

12. The device of claim 9, further comprising a substrate layer covering at least one of the first electrode or the second electrode.

13. The device of claim 9, further comprising a substrate layer covering both of the first electrode and the second electrode.

14. The device of claim 9, wherein the perovskite single crystal has a thickness between about 100 nm and about 1 cm.

15. The device of claim 9, wherein the first electrode is parallel to the second electrode and wherein an electric field is applied to the perovskite crystal layer to produce a p-i-n structure.

16. The device of claim 9, wherein the first electrode and the second electrode comprise different materials.

17. A perovskite single crystal radiation detector device, comprising:
a perovskite single crystal;
a first electrode disposed on a first surface of the perovskite single crystal; and
a second electrode disposed on the first surface of the perovskite single crystal,
wherein the perovskite single crystal has a thickness of less than about 3 cm between the first side and the second side, and wherein the perovskite single crystal has a diffusion length of about 3 mm or greater.

18. The device of claim 17, wherein the thickness of the perovskite single crystal is between about 1 µm and about 1 cm.

19. The device of claim 17, wherein the perovskite single crystal is a perovskite having a structure of $AMX_3$, wherein A is methylammonium ($CH_3NH_3+$), Cs+ or formamidinum ($H_2NCHNH_2+$), M is a metal cation, and X is a halide anion, thiocyanate (SCN—) or mixture of them.

* * * * *